(12) United States Patent
Tsui et al.

(10) Patent No.: US 7,769,108 B1
(45) Date of Patent: Aug. 3, 2010

(54) DIGITAL RECEIVER INSTANTANEOUS DYNAMIC RANGE ENHANCEMENT

(75) Inventors: James B. Y. Tsui, Dayton, OH (US);
David M. Lin, Beavercreek, OH (US);
Stephen L. Hary, Dayton, OH (US);
Nicholas A. Pequignot, Dayton, OH (US); Keith M. Graves, Springfield, OH (US); John M. Emmert, Concord, NC (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 1090 days.

(21) Appl. No.: 11/014,456

(22) Filed: Dec. 17, 2004

(51) Int. Cl.
*H03K 9/00* (2006.01)
(52) U.S. Cl. .............. 375/316; 375/267; 375/286; 375/320; 375/327; 375/340; 370/208; 370/363; 370/420
(58) Field of Classification Search .......... 375/243, 375/211, 214, 220, 222, 257, 345, 375, 219, 375/259, 260, 267, 316, 322, 342–343, 347, 375/349, 354; 455/67.1, 226.1, 226.2, 231.1, 455/303
See application file for complete search history.

(56) References Cited

U.S. PATENT DOCUMENTS

| 3,778,710 | A | 12/1973 | Snook |
| 5,151,779 | A | 9/1992 | Kanatsugu et al. |
| 5,194,865 | A | 3/1993 | Mason et al. |
| 5,315,527 | A | 5/1994 | Beckwith |
| 5,473,666 | A | 12/1995 | Szczebak, Jr. et al. |
| 5,544,064 | A | 8/1996 | Beckwith |
| 5,781,149 | A | 7/1998 | Long |
| 6,085,077 | A * | 7/2000 | Fields et al. ............ 455/303 |
| 6,750,901 | B1 | 6/2004 | Silverbrook |
| 6,765,611 | B1 | 7/2004 | Gallagher et al. |
| 7,565,125 | B2 * | 7/2009 | Audinot et al. .......... 455/234.2 |
| 2003/0078007 | A1 * | 4/2003 | Parssinen et al. ........... 455/67.1 |
| 2003/0215032 | A1 * | 11/2003 | Langlais et al. ............ 375/345 |
| 2004/0116092 | A1 * | 6/2004 | Hessel et al. ............ 455/232.1 |
| 2004/0230629 | A1 * | 11/2004 | Eguchi ........................ 708/490 |
| 2006/0082484 | A1 * | 4/2006 | Linder et al. ................. 341/155 |
| 2007/0206684 | A1 * | 9/2007 | Kazakevich et al. ........ 375/243 |

* cited by examiner

*Primary Examiner*—Shuwang Liu
*Assistant Examiner*—Hirdepal Singh
(74) *Attorney, Agent, or Firm*—AFMCLO/JAZ; Gerald B. Hollins; Fredric L. Sinder (57) ABSTRACT

A moderate cost and complexity digital radio receiver system having enhanced instantaneous dynamic range response to the receipt of simultaneous signals and also providing large single signal dynamic range. Multiple signal instantaneous dynamic range improvement is achieved through use of a suppressed zero signal amplitude representation arrangement having a selected number of signal amplitude representing digital bits rather than the larger entire array of digital output bits of the receiver system's analog to digital converter. Digital apparatus for accomplishing the selection of desired high order bits from the analog to digital converter output is also disclosed in detail. Use of a "Monobit" and related simplified Fourier transformation radio receivers as disclosed in identified previous patents of the recited inventors and colleagues is preferred for embodying the digital radio receiver circuit included in a present system.

10 Claims, 6 Drawing Sheets

DIGITAL RECEIVER INSTANTANEOUS DYNAMIC RANGE ENHANCEMENT

RIGHTS OF THE GOVERNMENT

The invention described herein may be manufactured and used by or for the Government of the United States for all governmental purposes without the payment of any royalty.

BACKGROUND OF THE INVENTION

In a digital radio receiver such as an electronic warfare receiver of the moderate cost and complexity type the available instantaneous dynamic range and the single signal dynamic range are two important but significantly different characteristics, characteristics of substantially different numeric magnitude. The first of these characteristics describes the receiver's ability to simultaneously detect two or more signals of differing signal strength at the same instant of time. The second of these characteristics relates to the ability of the receiver to detect a single signal of widely varying signal strength range. In certain of the "Monobit" and related receivers in the previous inventions of several of us and our colleagues (receivers built around the concept of using simplified approximated Kernel function realizations in the included Fourier transformation operation) it is often found that a significant single signal dynamic range is available however the multiple simultaneous signal instantaneous dynamic range characteristic is rather limited. Such receivers are for example disclosed in U.S. Pat. Nos. 5,793,323; 5,917,737; 5,963,164; 6,448,921 and 6,690,315 and in the U.S. Patent applications assigned the Ser. Nos. 09/917,589; 09/944,616; 10/008,476; 10/115,819 and 10/816,353. Each of these U.S. Patents and Patent Applications is hereby incorporated by reference herein.

Dynamic ranges of 70 and 2 decibels respectively are for example common for these two dynamic range characteristics of simple to moderate complexity digital radio receivers. The latter instantaneous dynamic range characteristic is in most instances less than five decibels in magnitude except in certain limited instances. The more complex and larger versions of a digital receiver of course provide better instantaneous dynamic range characteristics but are found to be unsuitable for some applications because of for example the size and cost they entail. Notwithstanding the limitations posed by the small instantaneous dynamic range of the "Monobit" and related receivers however they serve a growing need particularly in the military electronics art and in the airborne sector of this art; this need especially involves the simple one integrated circuit chip contained, simplified Kernel function version of the digital receiver as may be embodied into a larger system for example. The instantaneous dynamic range characteristics of such receivers may be improved-upon with the aid of the present invention; moreover such improvement can be achieved without compromise of the single signal dynamic range of the receiver and in keeping with the modest cost and size characteristics of the receiver.

SUMMARY OF THE INVENTION

The present invention provides a digital receiver system by which the instantaneous dynamic range characteristic of a digital receiver circuit may be enhanced while maintaining the desirable single signal dynamic range characteristic of the receiver circuit.

It is therefore an object of the present invention to provide a digital radio receiver system with improved performance characteristics in an environment inclusive of the simultaneous presence of strong and weak input signals.

It is another object of the invention to provide an improved ratio of instantaneous dynamic range to single signal dynamic range in a digital receiver of the moderate and simple complexity types.

It is another object of the invention to provide an improved instantaneous dynamic range for a monobit receiver and other modest complexity receiver types.

It is another object of the invention to provide an instantaneous dynamic range shifting arrangement for a digital radio receiver.

It is another object of the invention to enable a compact implementation of an improved instantaneous dynamic range digital radio receiver.

It is another object of the invention to provide a digital receiver in which only a limited number of digital bits in a generated signal amplitude defining word require ensuing signal processing.

It is another object of the invention to provide a simple highest bit sensor arrangement for a digital radio receiver.

It is another object of the invention to provide a digital radio receiver in which the ensuing circuitry processing of only a selected number of analog-to-digital converter output bits is needed.

It is another object of the invention to provide an improvement in the range of 15 to 20 decibels in the instantaneous dynamic range of a simple digital radio receiver.

These and other objects of the invention will become apparent as the description of the representative embodiments proceeds.

These and other objects of the invention are achieved by a cost considered digital radio receiver system of desirable instantaneous dynamic range characteristic, said system comprising the combination of:

an analog to digital converter circuit generating a succession of n bit digital amplitude sample words representing successive amplitude samples of an analog input radio frequency signal;

a greatest bit sensor in receipt of said succession of n bit digital amplitude sample words and identifying a succession of shorter k bit digital amplitude sample words each including a highest active bit and a selected reduced number of adjacent active bits from said n bit digital amplitude words;

a digital radio receiver circuit, of modest instantaneous dynamic range characteristics less than that of said n bit digital amplitude sample words, connected to said greatest bit sensor and receiving said shorter k bit digital amplitude sample words having a highest active bit and a selected reduced number of adjacent active bits from said greatest bit sensor;

said digital radio receiver system having an enhanced instantaneous dynamic range capability with respect to said digital radio receiver circuit of modest instantaneous dynamic range characteristics.

BRIEF DESCRIPTION OF THE DRAWINGS

The accompanying drawings incorporated in and forming a part of the specification, illustrate several aspects of the present invention and together with the description serve to explain the principles of the invention. In the drawings:

FIG. 2 includes the views of FIG. 2A, FIG. 2B and FIG. 2C and shows signal magnitude selection arrangements usable in the present invention.

FIG. 7 includes the views of FIG. 7A, FIG. 7B and FIG. 7C and shows details of the multiplexers in FIG. 5.

FIG. 8 includes the views of FIG. 8A and FIG. 8B and shows an alternate data format usable in achieving the invention.

DETAILED DESCRIPTION

Several approaches appear feasible to improve the instantaneous dynamic range of a "monobit" or other arrangement of a modest capability digital radio receiver. Some of these approaches are ultimately more successful than others in achieving the 15 to 20 dB improvement needed to accomplish a receiver of reasonably useful instantaneous dynamic range capability. In a receiver of this capability, a limiting radio frequency amplifier can no longer be used in a position preceding the analog-to-digital converter of the receiver since limiting amplifier presence will degrade the instantaneous dynamic range of the receiver. Also in such a receiver the analog-to-digital converter used should match the linear range of the amplifier.

In one possible receiver of improved instantaneous dynamic range characteristic for example a strong signal can be allowed to drive the radio frequency amplifier into saturation and the receiver is nevertheless considered to have received the strong signal. Such a receiver can be said to have a high single signal dynamic range. If however the receiver has been driven into saturation the instantaneous dynamic range characteristic and the ability to receive a small signal and a large signal will be decreased and will be below the desired 20 dB of magnitude. Thus this receiver arrangement cannot provide the desired combination of high single signal dynamic range and high instantaneous dynamic range simultaneously and a different receiver approach is needed.

A single signal dynamic range of 50 dB in combination with an instantaneous dynamic range of 20 dB is a reasonably satisfactory combination of receiver capabilities. This combination thus provides a goal for accomplishment using the present invention. With respect to single signal dynamic range the linear amplifier used in achieving a receiver system according to the present invention should therefore have a linear dynamic range of 50 dB and the analog-to-digital converter used should consequently have a 9-bit capacity. This 9-bit capacity arrives from the fact that generally each bit of an analog-to-digital converter provides 6 dB of dynamic range definition because each bit has two possible values and 20 log (2) is about 6. Therefore a 9 bit analog-to-digital converter can provide about 54 dB of dynamic range. For 20 dB of instantaneous dynamic range the analog-to-digital converter needs to have only about 4 bits of capacity.

Figure 1:
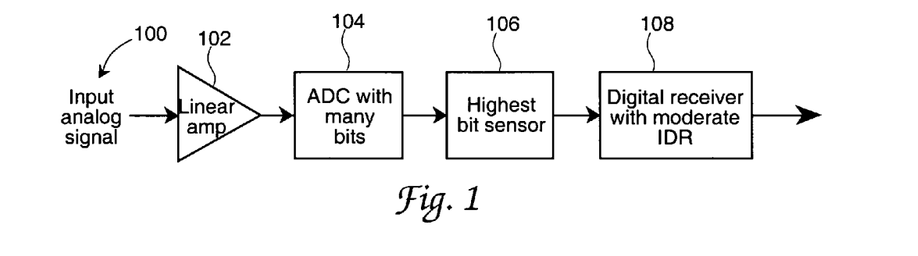
FIG. 1 shows a block diagram of a digital radio receiver of improved instantaneous dynamic range characteristics according to the present invention.
Figure 2A:
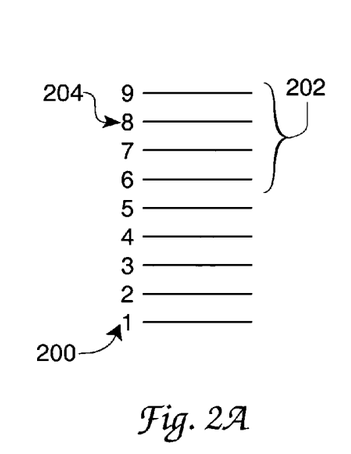
Figure 2B:
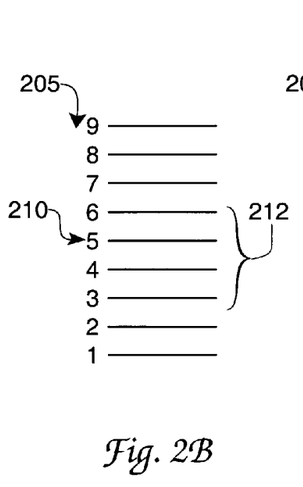
Figure 2C:
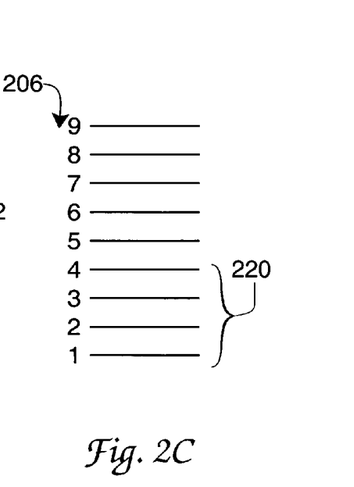

The input analog signals 100 of FIG. 1 are of a radio frequency signal nature. They are in bipolar or plus-minus symmetrical alternating current signals extending above and below a zero axis. Signals of this nature are amplified in the linear amplifier of block 102 in FIG. 1 and then applied to the analog-to-digital converter circuit 104. Following conversion to digital form the FIG. 1 signals are applied to a highest bit sensor circuit 106 as is discussed subsequently herein and then sent to a digital receiver of the monobit receiver or other moderate instantaneous dynamic range capability. FIG. 2 in the drawings shows an underlying concept of the present invention in a graphical form as represents a possible output of the analog-to-digital converter circuit 104. In this FIG. 2 drawing, which includes the views of FIG. 2A, FIG. 2B and FIG. 2C, the desired 50 dB of single signal dynamic range appears in the form of the 9 bits of analog-to-digital converter output signal data disposed along a vertical scale 200 in for example FIG. 2A. The FIG. 2 analog-to-digital converter output signal data are in two's complement binary format and bit 9 is sign bit.

Suppose for example that in FIG. 2A only the stated 4 bits of analog-to-digital converter output are needed to achieve the desired 20 dB of instantaneous dynamic range signal. In such instance if the upper 4 bits of analog-to-digital converter signal at 202 in FIG. 2A, bits 9,8,7, and 6, are selected for use in the digital receiver then whenever the positive part of a strong signal activating the greatest value bit, bit 8 at 204, of the analog-to-digital converter is received, the receiver is also capable of simultaneously detecting any other signal that is within the range of the communicated upper 4 bits of the analog-to-digital converter output. This means the ensuing digital receiver (a receiver of the "Monobit" or other moderate capability as described above) is capable of simultaneously detecting any other signal that is within 4×6 or about 24 dB of the received strong signal, i.e., receiving a signal as low as 50-24 or 26 dB of magnitude.

FIG. 2B in the drawings shows the application of this receiver system concept to the receipt of a signal of moderate strength. In this instance the largest value analog to digital converter output bit that is activated by the positive part of the incoming signal is bit 5 as indicated in the scale 205 at 210. This bit represents an incoming signal strength of some 6×6 or 36 dB and again provides a instantaneous dynamic range capability of some 24 dB or instantaneous dynamic range reception capability extending down to a level of 12 dB. Similarly if the positive part of the input signal only activates as high as bit 3 in the scale 206 as is represented in FIG. 2C then the available instantaneous dynamic range involves bits 1, 2, 3 and 4 and extends down to about 0 dB in magnitude as indicated at 220 in FIG. 2C.

Figure 3:
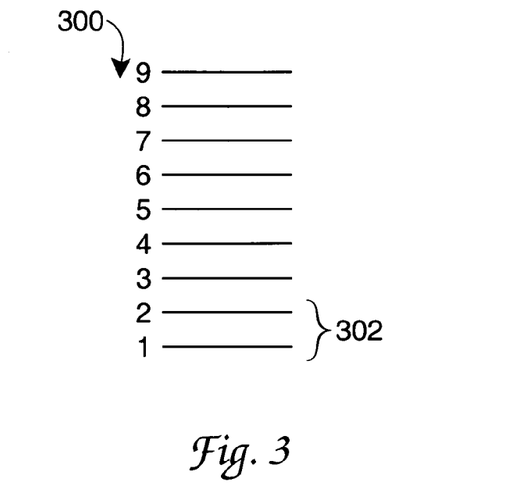
FIG. 3 shows a weak signal event for the present invention.

FIG. 3 in the drawings follows the signal representation scheme of FIG. 2 and shows a weak signal situation that may be encountered during use of the present invention receiver system. In this situation the input signal activates only bits 1 and 2 of the analog to digital converter along the scale 300 as is shown at 302. As a result of this weak signal an instantaneous dynamic range capability of less than the desired four bits and 20 dB is achieved. The response of a present invention receiver system is in this instance somewhat less than desired but is at least comparable to or on a par with that of other receivers handling such a low level signal.

To summarize the discussion involving FIG. 2 and FIG. 3, the present invention contemplates a digital radio receiver system having an instantaneous dynamic range capability that is smaller than its single signal dynamic range capability and employs this smaller instantaneous dynamic range in a selected manner. According to this selected manner the receiver circuit's limited instantaneous dynamic range is expanded upon by using a fractional portion of a digitized receiver system input signal, a portion that is compatible in magnitude with the receiver's instantaneous dynamic range capability. As the input signal of the receiver circuit this fractional portion is controlled by the amplitude of the received input signal and is in the example disclosed the largest four bits of the digitized received system input signal. These concepts are of course not fixed in magnitude and may be varied according to the receiver and the signals involved.

FIG. 1 in the drawings thus shows in block diagram form a preferred arrangement for achieving a digital radio receiver system operating in accordance with these concepts. In the FIG. 1 drawing an analog input signal 100 of for example 50 dB possible dynamic range is applied to the linear amplifier 102 and then to the analog to digital converter 104 having for example the above-described 9-bit output amplitude range. The highest bit sensor 106 detects the highest positive bit that is active in a succession of these 9-bit amplitude words. Thus in the terms of a presently considered example, for every 256 input data samples, i.e., every 256 analog-to-digital converter 9 bit outputs, the highest positive active bit is determined. The output of the analog-to-digital converter 104 is received in or placed in two's complement form. A new input arrives during each cycle of the sampling clock, $clk_{fs}$, appearing in the FIG. 4 drawing; there is a complete digitized series of n values for the digital receiver to process each n cycles; a reset signal R is received after each n cycles i.e., after each 256 input data samples.

In discussing an implementation for the highest bit sensor portion of the present invention it is helpful to define several variables relative to the involved input, output and processing signals; thus:

j represents any data bit under present consideration, k represents the number of bits in each assembly of bits sent to the digital receiver for each data sample, k is 4 in the example considered, m represents the number of bits of output from the analog-to-digital converter for each data sample; m is 9 in the example considered, n represents the total number of values or samples in the digitized series from the analog to digital converter, n is 256 in the example considered, Sel represents the most significant positive toggling bit from the analog to digital converter in each of the n or 256 samples, i.e., the highest value of j where Sj being a logic 1 indicates the most significant bit that changes for all n samples collected in the registers. Sel can have a value from m down to m-k.

Figure 4:
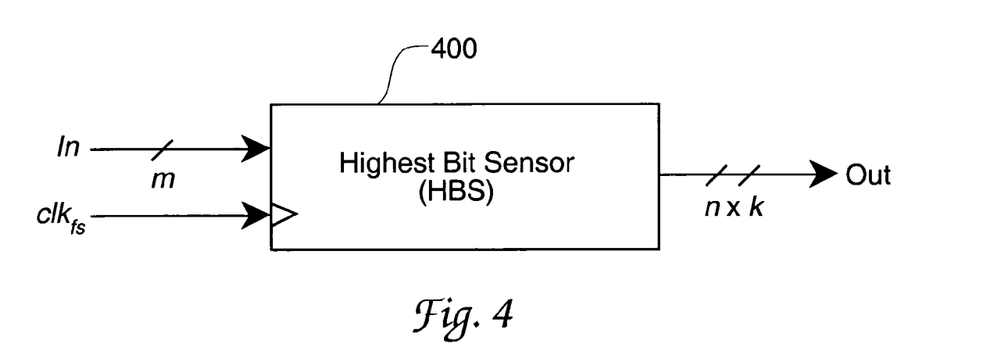
FIG. 4 shows signals employed in a highest bit sensor for the present invention.

FIG. 4 in the drawings showing the signals used in, and a block diagram identification for, a highest bit sensor apparatus 400 for the present invention. The function of this highest bit sensor is to select the k significant bits of the m bit input signal bits to be used in achieving a highest active bit identification i.e., to select the 4 significant bits of the 9 bit input signal words to be used in achieving a highest active bit identification. This highest active bit and three adjacent incrementally lower value bits provide the signal for digital receiver input according to the present invention. Internal details of a preferred arrangement of the FIG. 4 highest bit sensor circuit appear in the FIG. 5 drawing.

Figure 5:
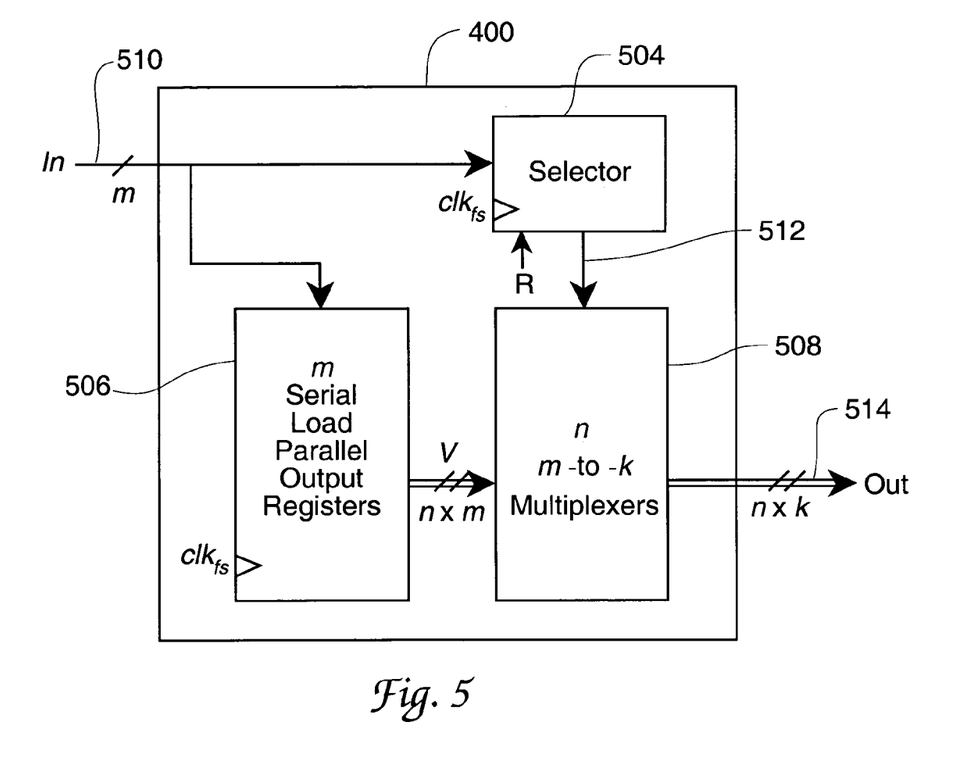
FIG. 5 shows components and their interconnection for a representative highest bit sensor for the invention.
Figure 6:
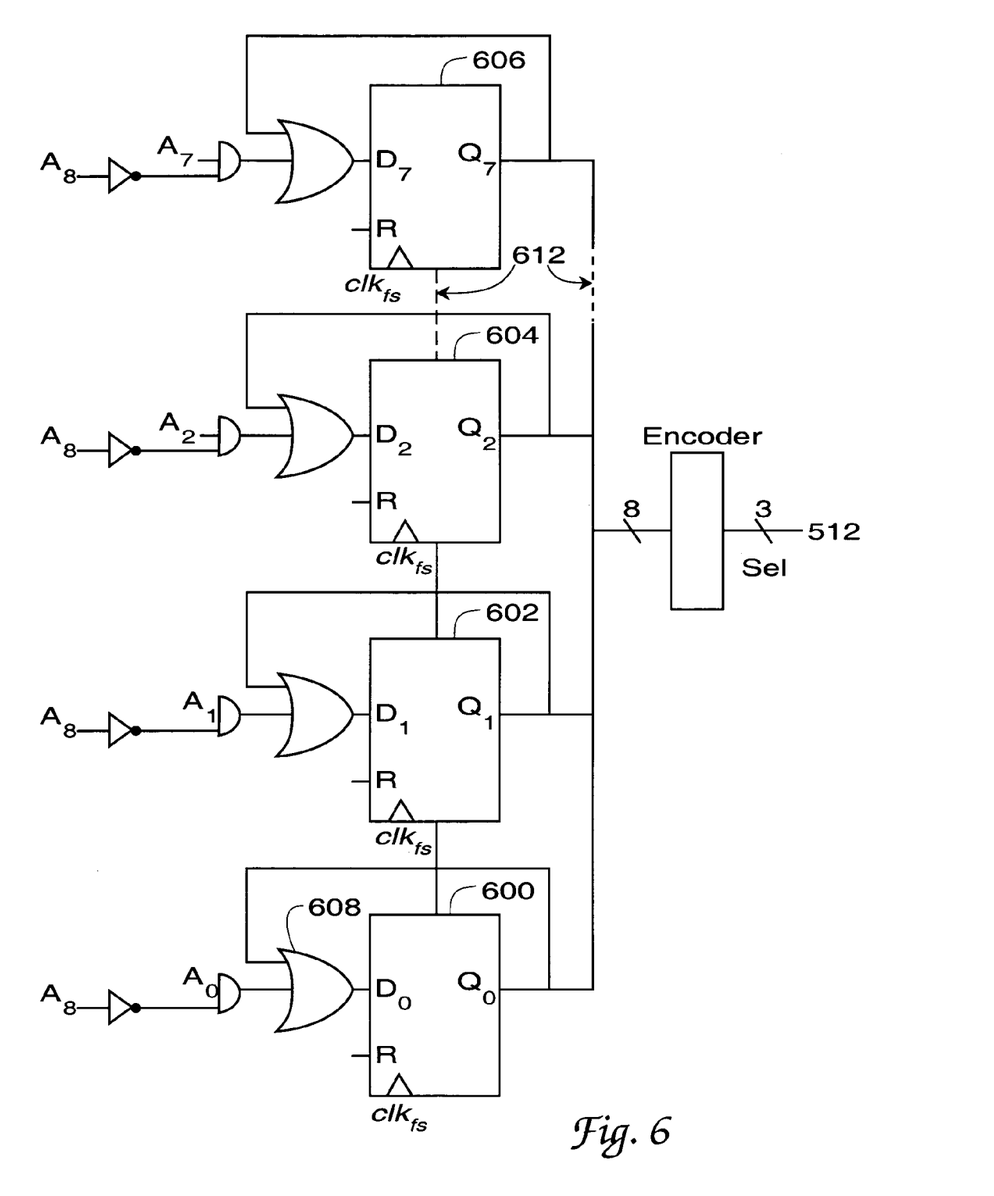
FIG. 6 shows a selector circuit usable with a non two's complement data format.

FIG. 6 in the drawings shows details of the flip-flop, AND gate, OR gate, and INVERTER circuits used to implement the selector subblock 504 in the FIG. 5 highest bit sensor circuit, i.e., used to remember the highest bit j of the greatest signal value received in the course of processing 256 input data samples of 9 analog to digital output bits each. In FIG. 6 four flip-flops 600, 602, 604 and 606 are shown with the latter of these being used for higher order data bits and with the omitted intervening flip-flops being represented at 612. The selector subblock 504 is reset at the start of each n or 256-value accumulation period thus it requires n cycles of the sampling clock $clk_{fs}$ to collect n values from the analog-to-digital converter for the digital processor. When the FIG. 6 reset signal, R, is activated the output of each of the flip-flops 600, 602, 604 and 606 in the selector subblock 504 is reset to the logic "0" state. During any one of the n cycles required for accumulation, if for example bit j is in the logic "1" state then the bit j is indeed significant and a required bit in the output of the selector subblock 504. On the next clock cycle, the output of the flip-flop for bit j will be set to a logic "1" state and will stay in this "1" state until the reset R appears for the next series of data. Based on the value of Sel the multiplexers will select k bits of each sample to output at 514 in FIG. 5 for further processing in the receiver 108.

In the lower bit of FIG. 6, if sign bit A8 is zero either a positive input value or an output of flip-flop 600 to the OR gate 608 can cause setting of the flip-flop 600, thus the OR gate output appears at the $Q_0$ output of flip-flop 600 after the next clock pulse. The flip-flop 600 remains in this set condition until reset by the next reset pulse R at the end of the n or 256 input data samples of the presently considered example. Thus the flip-flops 600, 602, 604 and 606 remember the largest analog to digital converter bit encountered during the n or 256 input data samples received from the analog to digital converter 104 in FIG. 1. Readers of this document knowledgeable of the digital electronic art may appreciate that the FIG. 6 flip-flop and OR gate configuration represents but one of a plurality of arrangements in which the highest four active bits memory can be achieved.

The m or 9 bits of analog to digital converter output arriving on the path 510 in FIG. 5 are also applied to the m or 9 bit serial load and parallel output registers indicated at 506 in the FIG. 5 drawing. There are actually n or 256 of these registers included at 506 so that the complete n or 256 input data samples between reset pulses can be stored. The output of the registers in block 506 is coupled to the n or 256 multiplexers of block 508 where the Sel signal from block 504 is used to select the four highest bits in each of the n or 256 input data samples. The manner of accomplishing this selection may be appreciated from the FIG. 7 drawing and its views of FIG. 7A, FIG. 7B and FIG. 7C.

Figure 7A:
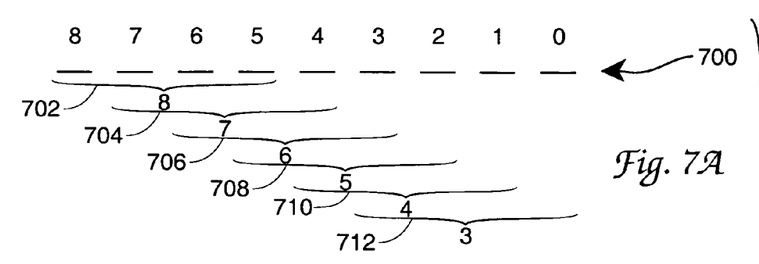

In FIG. 7A there is shown another representation of the data output desired from the FIG. 7 multiplexers, this representation may be considered as an alternate form of the data appearing in the views of FIG. 2, in a different and possibly more symbolic form. At 700 in FIG. 7A is shown the nine bits of data comprising each of the 256 data samples stored in the registers 506 of FIG. 5 together with bit identifications. At 702, 704, 706, 708, 710 and 712 in FIG. 7A are shown a series of six different brackets indicating the data to be communicated to the digital receiver 108 in FIG. 1 according to the location of the highest active bit of data in each of the possible data samples. A data sample having bit 3 of the bits at 700 active should for example result in the data of bracket 710 or bits 4, 3, 2, and 1 being communicated to receiver 108. The six sample cases shown in FIG. 7A represent the variable Sel having values from 8 down to 3.

Figures 7B, 7C:
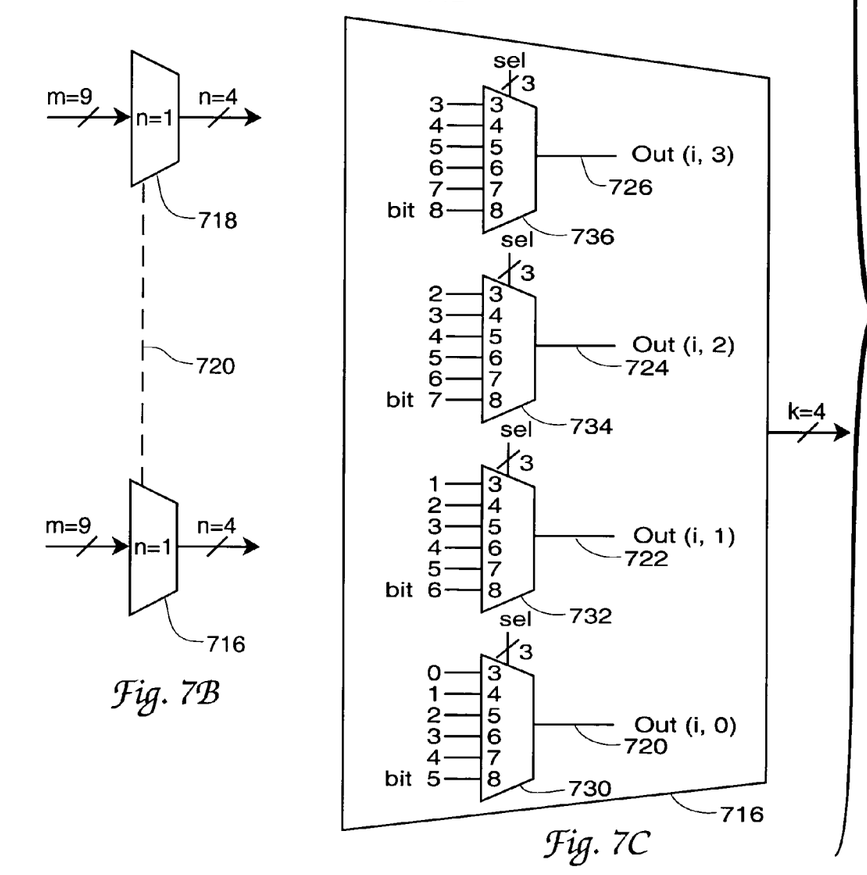

The manner of accomplishing the receiver 108 input data communication called-for in FIG. 7A is shown in an overall perspective in the FIG. 7B drawing. In this drawing n or 256 multiplexers are represented by the two multiplexers identified at 716 and 718 and the intervening dotted line 720. Details concerning one of the FIG. 7B illustrated multiplexers, such as the multiplexer 716, appear in the FIG. 7C drawing where multiplexers 730, 732, 734 and 736, feeding output signal paths 720, 722, 724 and 726 respectively, are shown. The Sel signal at 512 in FIG. 5 determines which of the different input bit patterns shown for the multiplexers 730, 732, 734 and 736 is appropriate; this Sel signal can have a value from m down to m-k.

Thus a secondary function of the highest bit sensor in block 400 of FIG. 4 is to temporarily collect and output a series of n digitized values to serve as input to the digital receiver 108 in FIG. 1. For the digital receiver 108 to properly process the n-element series, it is desirable to be certain that the same k bits are used for each element of the series. Thus the highest bit sensor 400 uses m serial load/parallel output registers shown in the subblock 506 to collect n m bit values from the input, In, and form an n×m bit series, V. Based on the value of Sel the highest bit sensor will use the n, m-to-k multiplexers of subblock 508 in FIG. 5 to convert each m bit value in V to a k bit value that will be output to the digital processor.

The digital receiver with moderate instantaneous dynamic range represented at 108 in the FIG. 1 drawing may be of several different types. The monobit and related forms of digital receiver in which a Fourier transformation operation is approximated by unitary magnitude vectors is one group of possible receivers for this application. Details regarding such receivers and their characteristics are disclosed in the above identified and incorporated by reference herein patents.

Figure 8A:
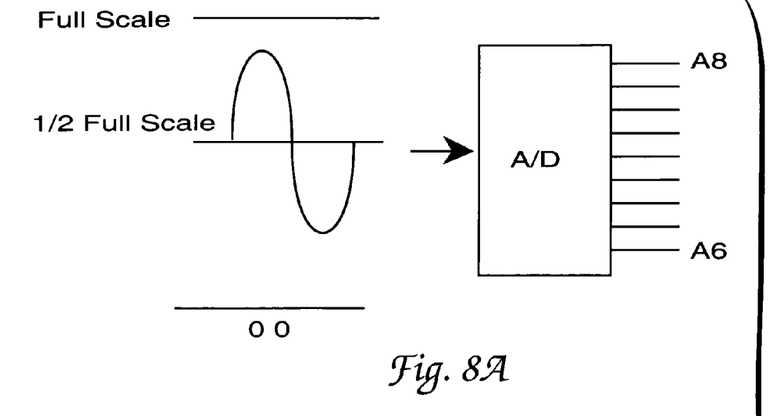
Figure 8B:
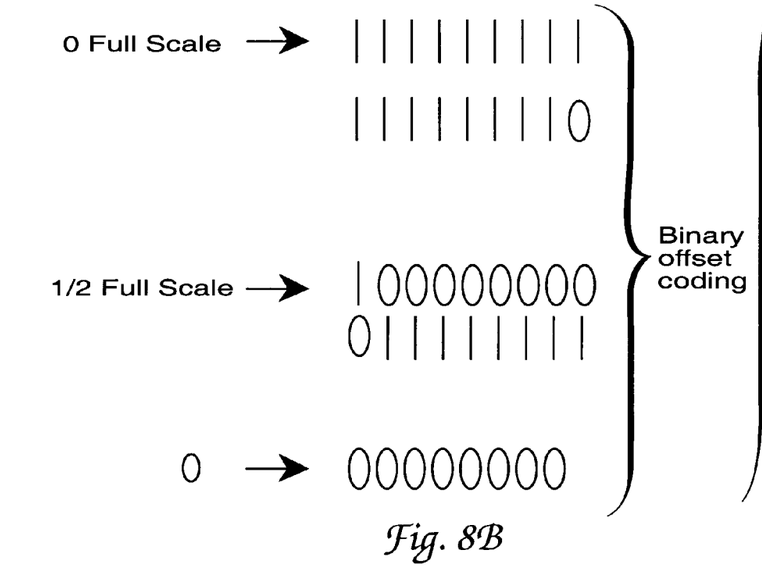

FIG. 8 in the drawings includes the views of FIG. 8A and FIG. 8B and shows an alternate input data format expressed in the form of binary offset coding wherein an offset value is subtracted from the analog to digital converter output in lieu of using the twos complement arithmetic form discussed above.

The function of the present signal highest active bits selection invention may thus be thought of as being somewhat like an instantaneously acting automatic gain control (AGC) system for a digital radio receiver. The action of the described system in identifying the highest four active bits found in each of the two hundred fifty six for example analog-to-digital converter output words as these words enter storage memory and then using the knowledge of these four highest active bits to determine which memory bits should be connected with the ensuing monobit receiver circuit during memory output can be appreciated to have AGC like characteristics except that the signal delay usually associated with an AGC system may be considered absent. Both the presently described invention and a receiver AGC system may be appreciated to provide a capability for enhancing the acceptable dynamic range capability of the coupled radio receiver circuit.

Finally, it is believed also informative to appreciate that in the absence of the present invention a monobit receiver can provide 20 dB of dynamic range. With use of the present invention however the monobit receiver can theoretically process a lone large signal that is some 50 dB greater than the smallest possible signal. With two signals received simultaneously by the present invention the larger signal can be 20 dB greater than the small signal for successful processing.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. A cost considered digital radio receiver system combining a desirable instantaneous dynamic range with an acceptable single signal dynamic range, said system comprising the combination of:

an analog to digital converter circuit generating a succession of n bit output digital amplitude sample words representing successive amplitude samples of an analog input radio frequency signal;

a greatest bit sensor in receipt of said succession of n bit output digital amplitude sample words and identifying a succession of shorter k bit output digital amplitude sample words each including a highest active bit and a reduced number of adjacent active bits from said n bit digital amplitude words selected to provide a desirable instantaneous dynamic range; and a digital radio receiver circuit, of modest instantaneous dynamic range characteristics less than that of said n bit output digital amplitude sample words, connected to said greatest bit sensor and receiving said shorter k bit output digital amplitude sample words having a highest active bit and said reduced number of adjacent active bits from said greatest bit sensor;

said digital radio receiver system having an enhanced instantaneous dynamic range capability with respect to said digital radio receiver circuit of modest instantaneous dynamic range characteristics wherein said n bit and k bit numbers are positive integers.

2. The cost considered digital radio receiver system of claim 1 wherein said succession of n bit output digital amplitude sample words includes a succession of magnitudes each a different specimen of an analog radio frequency input signal of said digital radio receiver system.

3. The cost considered digital radio receiver system of claim 1 wherein said digital radio receiver circuit of modest instantaneous dynamic range characteristics includes a Fourier transformation operation.

4. The cost considered digital radio receiver system of claim 1 wherein said digital radio receiver circuit, of modest instantaneous dynamic range characteristics includes a unity value approximated Fourier transformation operation.

5. The cost considered digital radio receiver system of claim 1 wherein said succession of n bit output digital amplitude sample words includes a 256 word succession of nine bit magnitude words each a different specimen of an analog radio frequency input signal of said digital radio receiver system.

6. The cost considered digital radio receiver system of claim 1 wherein said receiver system and said receiver circuit each include a single signal dynamic range characteristic of at least fifty decibels magnitude.

7. A low cost digital radio receiver system combining an enhanced instantaneous dynamic range with an acceptable single signal dynamic range with respect to an incorporated digital radio receiver, said system comprising the combination of:

an analog to digital converter circuit generating an n word succession of m bit digital amplitude measuring words representing successive amplitudes of an analog input radio frequency signal;

a digital electronic greatest bit sensor circuit in receipt of said succession of m bit digital amplitude measuring words and identifying a succession of k bit digital amplitude measuring words each including a highest active bit and k−1 adjacent successive active bits from said m bit digital amplitude measuring words selected to provide a desirable instantaneous dynamic range;

an approximated Fourier transformation inclusive digital radio receiver circuit, of less than five decibels simultaneous signal instantaneous dynamic range characteristics, connected to said digital electronics greatest bit sensor circuit and receiving said k bit digital amplitude measuring words having a highest active bit and k−1 sequentially adjacent successive active bits;

said digital radio receiver system having an enhanced instantaneous dynamic range capability greater than said five decibels characteristic of said digital radio receiver circuit; and wherein said n word, m bit and k bit numbers are selectable positive integer variables.

8. The low cost digital radio receiver system of claim 7 wherein said n word, m bit and k bit selected variables have numeric values of two hundred fifty six, nine and four respectively.

9. A low cost digital radio receiver system combining an enhanced instantaneous dynamic range with an acceptable single signal dynamic range with respect to an incorporated digital radio receiver, said system comprising a combination of:

an analog to digital converter circuit generating an n word succession of m bit digital amplitude measuring words representing successive amplitudes of an analog input radio frequency signal;

a digital electronic greatest bit sensor circuit in receipt of said succession of m bit digital amplitude measuring words and identifying a succession of k bit digital amplitude measuring words each including a highest active bit and k−1 adjacent successive active bits from said m bit digital amplitude measuring words selected to provide a desirable instantaneous dynamic range;

an approximated Fourier transformation inclusive digital radio receiver circuit, of less than five decibels simultaneous signal instantaneous dynamic range characteristics, connected to said digital electronics greatest bit sensor circuit and receiving said k bit digital amplitude measuring words having a highest active bit and k−1 sequentially adjacent successive active bits;

said digital radio receiver system having an enhanced instantaneous dynamic range capability greater than said five decibels characteristic of said digital radio receiver circuit;

wherein said n word, m bit and k bit numbers are selectable positive integer variables;

wherein said n word, m bit and k bit selected positive integer variables have numeric values of two hundred fifty six, nine and four respectively; and wherein said digital electronic greatest bit sensor circuit comprises;

an input signal path connecting a two's complement input signal with a bipolar signal responsive absolute value determining circuit and with a serial load parallel output register memory of said two hundred fifty six word succession of nine bit digital amplitude measuring words capacity;

a highest active bit sensor circuit connected with an output of said absolute value determining circuit and generating an output indication of a highest active bit in each nine bit word of said two hundred fifty six word succession of digital amplitude measuring words; and a multiplexer switching circuit array connected with said serial load parallel output register memory and controlled by an output of said highest active bit sensor circuit to generate a four bit output word of said greatest bit sensor circuit, an output word replicating a highest value active bit and three adjacent successively lower value bits for each two hundred fifty six of said nine bit digital amplitude measuring words.

10. The low cost digital radio receiver system of claim 9 wherein said approximated Fourier transformation inclusive digital radio receiver circuit, of less than five decibels simultaneous signal instantaneous dynamic range characteristics also has a single signal dynamic range in excess of fifty decibels.

* * * * *